US 7,759,903 B2

(12) United States Patent
Kamata (10) Patent No.: US 7,759,903 B2
(45) Date of Patent: Jul. 20, 2010

(54) BATTERY VOLTAGE MEASUREMENT CIRCUIT, BATTERY VOLTAGE MEASUREMENT METHOD, AND BATTERY ELECTRIC CONTROL UNIT

(75) Inventor: Seiji Kamata, Miyagi (JP)

(73) Assignee: Keihin Corporation, Tokyo (JP)

( * ) Notice: Subject to any disclaimer, the term of this patent is extended or adjusted under 35 U.S.C. 154(b) by 457 days.

(21) Appl. No.: 11/725,554

(22) Filed: Mar. 20, 2007

(65) Prior Publication Data

US 2007/0285083 A1 Dec. 13, 2007

(30) Foreign Application Priority Data

Mar. 23, 2006 (JP) ............................. 2006-081589

(51) Int. Cl.
*H02J 7/00* (2006.01)
*H02J 7/04* (2006.01)
*H02J 7/16* (2006.01)
*G01N 27/416* (2006.01)

(52) U.S. Cl. .................. 320/134; 320/132; 320/152; 324/433

(58) Field of Classification Search ................. 324/433, 324/434; 320/134
See application file for complete search history.

(56) References Cited

U.S. PATENT DOCUMENTS 6,094,031 A * 7/2000 Shimane et al. ............. 320/118
6,236,216 B1 * 5/2001 Shimoyama et al. ........ 324/434
6,646,442 B2 * 11/2003 Katoh ......................... 324/433
7,187,159 B2 * 3/2007 Katoh ......................... 323/285
7,196,523 B1 * 3/2007 Yamada ...................... 324/428
7,248,020 B2 * 7/2007 Hidaka et al. ............... 320/134
2005/0264296 A1 * 12/2005 Philbrook .................... 324/433

FOREIGN PATENT DOCUMENTS

| JP | 11-113182 | 4/1999 |
| JP | 2002-122643 | 4/2002 |
| JP | 2002-156392 | 5/2002 |
| JP | 2003-70171 | 3/2003 |

* cited by examiner

*Primary Examiner*—Edward Tso
*Assistant Examiner*—Ahmed Omar
(74) *Attorney, Agent, or Firm*—Kratz, Quintos & Hanson, LLP (57) ABSTRACT

A voltage between both terminals of each unit battery is amplified by a differential amplifier and is then converted by a converter into a predetermined physical quantity that corresponds to the voltage between both terminals of the unit battery. The converted physical quantity is then level-shifted by a detection circuit and is converted into a voltage on a reference potential of the lowest electric potential of the battery assembly. A control unit sequentially selects the converted voltages by a multiplexer, generates serial digital signals by an A/D conversion, and then transmits the serial digital signals to a control operation unit via an isolation buffer circuit. It is, therefore, possible to provide a battery voltage measurement circuit capable of measuring a voltage of each of unit batteries constituting a battery assembly with high accuracy by using a common measurement circuit in a relatively simple and inexpensive configuration.

6 Claims, 5 Drawing Sheets

BATTERY VOLTAGE MEASUREMENT CIRCUIT, BATTERY VOLTAGE MEASUREMENT METHOD, AND BATTERY ELECTRIC CONTROL UNIT

CROSS-REFERENCE TO RELATED APPLICATION(S)

This application claims the foreign priority benefit under Title 35, United States Code, §119 (a)-(d), of Japanese Patent Application No. 2006-81589, filed on Mar. 23, 2006 in the Japan Patent Office, the disclosure of which is herein incorporated by reference in its entirety.

BACKGROUND OF THE INVENTION

1. Field of the Invention

The present invention relates to a system for measuring a voltage of each of cells constituting a battery assembly having a large number of cells, which are connected in series.

2. Description of the Related Art

In hybrid vehicles, electric vehicles, fuel-cell vehicles or the like, it has become common to configure a high-voltage battery assembly by connecting in series a plurality of unit batteries including rechargeable batteries or fuel cells in order to reduce the loss due to wiring resistance or reduce the size of a switching element. In the case that a fuel cell is used, for example, a cell voltage of a fuel cell is around 1 volt, and therefore generally several hundreds of cells are connected in series to provide a required high voltage. In such a case, when one of unit batteries has a trouble and operates with an extreme low or high voltage, the unit battery having a trouble can cause corrosion or insufficient voltage resistance, which can result in the breakage of a whole battery assembly. Therefore, when such a battery assembly is used, a voltage of one unit battery or voltages of a plurality of unit batteries are sequentially scanned at a time to measure and monitor a voltage, thereby making it possible to promptly deal with any trouble.

There have been known examples for monitoring a voltage as mentioned above. Japanese Laid-open Patent Application Hei 11-113182 (Paragraph [0017]; FIG. 1) discloses an example for detecting a voltage of each of unit batteries by different differential amplifiers by using a bottom terminal as a reference. Japanese Laid-open Patent Application No. 2003-70171 (Paragraph [0017]; FIG. 1) discloses an example for detecting a voltage of each of batteries by using a virtual ground, which has the same electric potential as that of a midpoint of an battery assembly, as a reference.

Japanese Laid-open Patent Application No. 2002-156392 (Abstract; FIG. 1) discloses a so-called flying capacitor technique. In this technique, a voltage of each unit battery is sequentially applied to a flying capacitor through a pair of multiplexers, and then the multiplexers are shut off to sample and hold the voltage of the unit battery. Then, each end of the flying capacitor is electrically conducted to a voltage detection circuit via an analog switch, which is designed to output an electrical potential of a capacitor, so that a potential difference of the flying capacitor, i.e. a storage voltage of the flying capacitor is detected by the voltage detection circuit.

In an example disclosed in Japanese Laid-open Patent Application No. 2002-122643 (Paragraph [0044-0048]; FIG. 1), a voltage of each unit battery is input to a pair of input terminals of a first stage differential amplifier via a pair of multiplexers. Then, the first stage differential amplifier differentially amplifies a voltage on a reference potential of a bottom potential of a battery assembly. An output voltage of the first stage differential amplifier is amplified by a subsequent stage differential amplifier by using a ground potential of a vehicle body as a reference, and then an output voltage of the subsequent stage differential amplifier is A/D converted.

In the above-mentioned systems in Japanese Laid-open Patent Applications Hei. 11-113182 and No. 2003-70171, however, a reference voltage of a first stage differential amplifier or a converter, which detects an input voltage of a unit battery, is a bottom terminal or a virtual ground having the same potential as that of a midpoint of a battery assembly. In such a case, a voltage to be input to a first stage amplifier or a converter increases. Therefore, it is difficult to obtain a large gain, and the accuracy of the voltage detection is deteriorated. Furthermore, an increase of a dark current causes a problem that the accuracy of the voltage detection can not be sufficiently obtained. In the flying capacitor technique as disclosed in Japanese Laid-open Patent Application No. 2002-156392, a high voltage section on the battery side and a low voltage section connected to a ground potential of a vehicle body are electrically insulated from each other so that elements need to be provided with voltage resistance in both directions. Therefore, a large number of elements having high voltage resistance in both directions are necessary, which results in the increase of the cost. Furthermore, in above-mentioned Japanese Laid-open Patent Applications Nos. 2002-156392 and 2002-122643, a switch is changed over to input a voltage in a common microcomputer and a common A/D converter. However, such configuration is likely to be affected by noises due to parasitic capacity or the like. With the configuration disclosed in Japanese Laid-open Patent Application No. 2002-122643 wherein a voltage is measured by using a grounded vehicle body as a reference, a reference potential of a battery assembly and a potential of a vehicle body are electrically insulated from each other. Therefore, there easily occurs a noise, a cause of which is difficult to determine, and the configuration is likely to be affected by parasitic noises.

SUMMARY OF THE INVENTION

In order to solve the above problems, the present invention has an object of providing a battery voltage measurement circuit, a battery voltage measurement method, and a battery electric control unit wherein a voltage of each of unit batteries constituting a battery assembly can be measured with high accuracy by using a common measurement circuit in a relatively simple and inexpensive configuration.

According to the first aspect of the present invention, there is provided a battery voltage measurement circuit that measures a voltage between both electrodes of each unit battery in a battery assembly having a plurality of unit batteries which are connected in series. The battery voltage measurement circuit comprises a conversion unit that is provided with each unit battery and converts a voltage between both electrodes of the unit battery into a predetermined physical quantity, and a common measurement unit that processes and measures the physical quantity converted by the conversion unit with respect to each unit battery.

With this configuration, it is possible to provide a battery voltage measurement circuit capable of measuring a voltage in a simple and easy manner, wherein voltages are measured in a common unit by using a converted physical quantity which can be easily processed.

According to the second aspect of the present invention, there is provided a battery voltage measurement circuit wherein the measurement unit includes an A/D conversion unit that converts the voltage between both electrodes of the unit battery into a corresponding digital signal.

With this configuration, it is possible to convert the voltage into a digital value, which can be directly measured by computing, by a relatively simple and inexpensive measurement unit, and process the measurement easily.

According to the third aspect of the present invention, there is provided the battery voltage measurement circuit further comprising a level shifting unit that is provided with the conversion unit and converts the physical quantity converted by the conversion unit into a voltage on a reference potential of a lowest electric potential of the battery assembly. In the battery voltage measurement circuit, the measurement unit sequentially outputs digital values corresponding to voltages on a reference potential of a lowest electric potential of the battery assembly with respect to each unit battery.

With this configuration, because a voltage between both electrodes of each unit battery is converted into a voltage on a reference potential of the lowest electric potential of the battery assembly, it is possible to sequentially measure voltages with high accuracy by a single and common measurement unit.

According to the fourth aspect of the present invention, there is provided the battery voltage measurement circuit wherein the conversion unit that corresponds to each of the unit batteries is formed into groups consisting of the predetermined number of the conversion units, which are adjacent to each other; each group is provided with a charge pump circuit; and the conversion unit in each group operates with a power supply from the charge pump circuit associated with the each group.

It is, therefore, possible to provide a power source, which is appropriate for an electric potential of a terminal of a unit battery to be measured, in a relatively simple manner, thereby facilitating the measurement of a voltage.

According to the fifth aspect of the present invention, there is provided the battery voltage measurement circuit further comprising a DC/DC converter that is electrically insulated from the battery assembly and is used as a power source of each charge pump circuit.

It is, therefore, possible to provide a stable power source for a group consisting of the conversion units without being affected by an output voltage of the battery assembly.

According to the sixth aspect of the present invention, there is provided the battery voltage measurement circuit wherein the conversion unit includes a voltage/current conversion unit that converts the voltage between both electrodes of the unit battery into a corresponding magnitude of an electric current.

With this configuration, it is possible to convert a voltage in a relatively simple and inexpensive conversion unit, and a level-shifting process and a measurement process can be easily performed.

According to the seventh aspect of the present invention, there is provided the battery voltage measurement circuit wherein the conversion unit includes a voltage/frequency conversion unit that converts the voltage between both electrodes of the unit battery into an alternating signal having a corresponding frequency.

With this configuration, it is possible to convert a voltage in a relatively simple and inexpensive conversion unit, and a level-shifting process and a measurement process can be easily performed.

According to the eighth aspect of the present invention, there is provided the battery voltage measurement circuit further comprising: a control operation unit that is electrically insulated from the battery assembly; and a transmitting unit that electrically transmits the digital value corresponding to the voltage between both electrodes of the unit battery from the measurement unit into the control operation unit while keeping insulation between the battery assembly and the control operation unit.

With this configuration, the insulation between the battery assembly and the control operation unit can be maintained, and therefore there is no possibility that the control operation unit is affected by the battery assembly, thereby improving the reliability of the control operation unit.

According to the ninth aspect of the present invention, there is provided a battery voltage measurement method in a battery voltage measurement circuit that measures a voltage between both electrodes of each unit battery in a battery assembly having a plurality of unit batteries which are connected in series. The battery voltage measurement method comprises the steps by the battery voltage measurement circuit of: (a) differentially amplifying a voltage between both electrodes of each unit battery; (b) converting an output voltage obtained in the step (a) into a predetermined physical quantity; (c) level-shifting the physical quantity converted in the step (b) into a voltage on a reference potential of the lowest electric potential of the battery assembly; and (d) measuring the voltage, which is level-shifted in the step (c), by a common measurement unit with respect to each unit battery.

A voltage between both electrodes of the unit battery of the battery assembly is level-shifted into a voltage on a reference potential of the lowest electric potential of the battery assembly, and therefore it is possible to measure a voltage by a single and common measurement unit having voltage resistance on one side, thereby facilitating the battery voltage measurement.

According to the tenth aspect of the present invention, there is provided a battery electric control unit (ECU) that measures a voltage between both electrodes of each unit battery in a battery assembly having a plurality of unit batteries which are connected in series. The battery ECU comprises a processing unit incorporating: a differential amplification unit that is provided with each unit battery and detects a voltage between both electrodes of the unit battery through an input unit to output a detected voltage; a conversion unit that is provided with each differential amplification unit and converts the detected voltage from the differential amplification unit into a predetermined physical quantity; a level shifting unit that level-shifts the physical quantity converted by the converter into a voltage on a reference potential of a lowest electric potential of the battery assembly; and a measurement unit that measures the voltage level-shifted by the level shifting unit.

A voltage between both electrodes of the unit battery of the battery assembly is level-shifted into a voltage on a reference potential of the lowest electric potential of the battery assembly, and therefore it is possible to measure a voltage by a single and common measurement unit having voltage resistance on one side, thereby facilitating the battery voltage measurement.

According to the eleventh aspect of the present invention, there is provided the battery ECU wherein the processing unit is an integrated circuit.

It is, therefore, possible to reduce the size of the battery ECU.

According to the present invention, a voltage between both electrodes of each of unit batteries constituting a battery assembly is level-shifted to a voltage on a reference potential of the lowest electric potential of the battery assembly, thereby making it possible to measure a voltage by using a single and common measurement unit having voltage resistance on one side. It is, therefore, possible to measure a voltage of each unit battery of the battery assembly with high accuracy in an inexpensive configuration without reducing the safety.

BRIEF DESCRIPTION OF THE DRAWINGS

The object and features of the present invention will become more readily apparent from the following detailed description taken in conjunction with the accompanying drawings in which.

DETAILED DESCRIPTION OF THE INVENTION

Hereinafter, embodiments of the present invention will be described in detail with reference to the attached drawings.

The same components will be denoted by the same references in the drawings.

Figure 1:
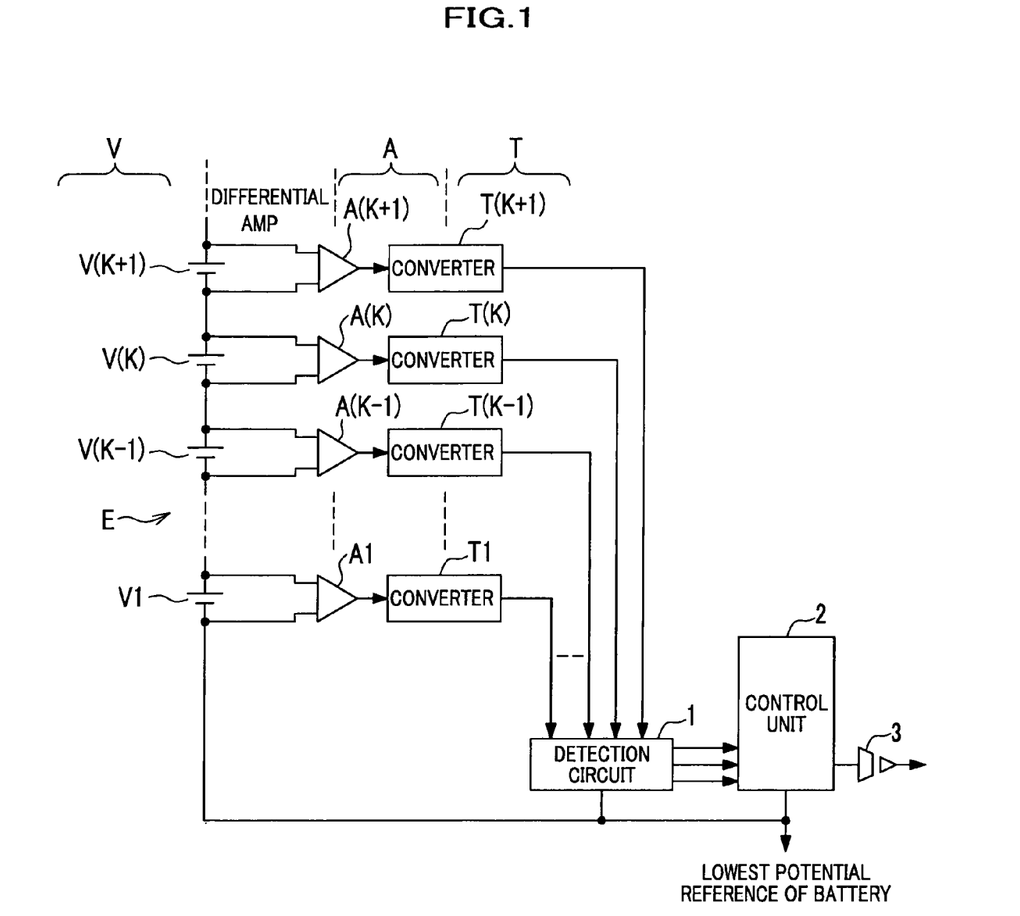
FIG. 1 is a schematic block diagram of a battery voltage measurement circuit according to an embodiment of the present invention.

FIG. 1 is a schematic block diagram of a battery voltage measurement circuit according to an embodiment of the present invention. In FIG. 1, the reference marks V, A, and T are accompanied by characters for their identification. When K (integral number) and a number added to or subtracted from K are accompanied by the reference marks V, A, and T, the characters are indicated in parenthesis after K. The reference mark E denotes a battery assembly that is an object to be measured. The reference marks V1, . . . , V(K), . . . denote individual unit batteries constituting the battery assembly E. The reference marks A1, . . . , A(K), denote differential amplifiers (AMP) that detect a voltage of each of the unit batteries V1, . . . , V(K), . . . . The reference marks T1, . . . , T(K), . . . denote converters that convert an output of each of the differential amplifiers A1, . . . , A(K), . . . into a predetermined physical quantity. The reference number 1 denotes a detection circuit that inverts the physical quantity converted by each of the converters T1, . . . , T(K), . . . into an electronic signal on a reference potential of the lowest electric potential of the battery assembly E. The electronic signal is, for example, a direct-current signal having a voltage that corresponds to an output voltage of each of the unit batteries V1, . . . , V(K), . . . , or an alternating-current signal having a frequency that corresponds to an output voltage of each of the unit batteries V1, . . . , V(K), . . . . The electronic signal is hereinafter referred to as a converted signal. The reference number 2 denotes a control unit on a high-voltage section, and the control unit has a multiplex function and an A/D conversion function. The multiplex function is used to sequentially output the converted signals in the order which begins from a converted signal that corresponds to the lowest unit battery of the battery assembly E. A converted signal, which is output from the detection circuit 1, corresponds to a voltage of each of the unit batteries V1, . . . , V(K), . . . . The A/D conversion function is used to convert an input converted signal into a digital signal representing a value that corresponds to a voltage or a frequency of the converted signal. The reference number 3 denotes an isolation buffer circuit that transmits a signal output from the control unit 2 to a low-voltage section. A signal from the control unit 2 is transmitted to a control operation unit, which is connected to a grounded vehicle body, via the isolation buffer circuit 3, and is then processed. The control operation unit will be described later.

The converter T is included in a conversion unit set forth in the claims. The detection circuit 1 includes a function of a level-shifting unit in the claims and the control unit 2 includes a function of a measurement unit in the claims.

With reference to FIG. 1, a description will be given on basic operations of the battery voltage measurement circuit according to an embodiment of the present invention.

A voltage between both terminals of each unit battery V is amplified by the differential amplifier A, and is then converted by the converter T into a predetermined physical quantity that corresponds to the voltage between both terminals of the unit battery V. The physical quantity, which is converted by the converter T, is level-shifted by the detection circuit 1, and is converted into a voltage on a reference potential of the lowest electric potential of the battery assembly E.

Thus, an output voltage from the detection circuit 1, which has been level-shifted to a voltage on a common reference potential, corresponds to the voltage between both terminals of the unit battery V. The control unit 2 sequentially selects the above-mentioned output voltages, which respectively correspond to the voltages between both terminals of the unit batteries V, by a multiplexer, converts the voltages by an A/D conversion to generate serial digital signals, and then transmits the serial digital signals to the control operation unit via the isolation buffer circuit 3 such as a photo-coupler.

The physical quantity converted by the converter T must correspond to a potential difference between both terminals of each unit battery V. However, the converted physical quantity may be irrelevant to an electric potential of each terminal of the unit battery V. Therefore, the converted physical quantity is level-shifted by the detection circuit 1, and is then converted into a voltage on a common reference potential of the lowest electric potential of the battery assembly E, so that it is possible to acquire a voltage on a common reference potential of the lowest electric potential of the battery assembly E, i.e. a potential of 0 (zero) volt, and that corresponds to a voltage between both terminals of each unit battery V. That is, it is possible to acquire a voltage on a reference potential of 0 (zero) volt. Because there is no variation in the reference potentials of the unit batteries, output voltages of all the unit batteries can be measured with high accuracy by using the common detection circuit 1 and the common control unit 2.

A voltage between both terminals of the unit battery V must fall within the range between positive and negative voltages of each of power sources of the differential amplifier A and the converter T. For this reason, it is necessary to provide a plurality of power sources with the unit batteries V. For example, a charge pump circuit may be used as a power source.

Figure 2:
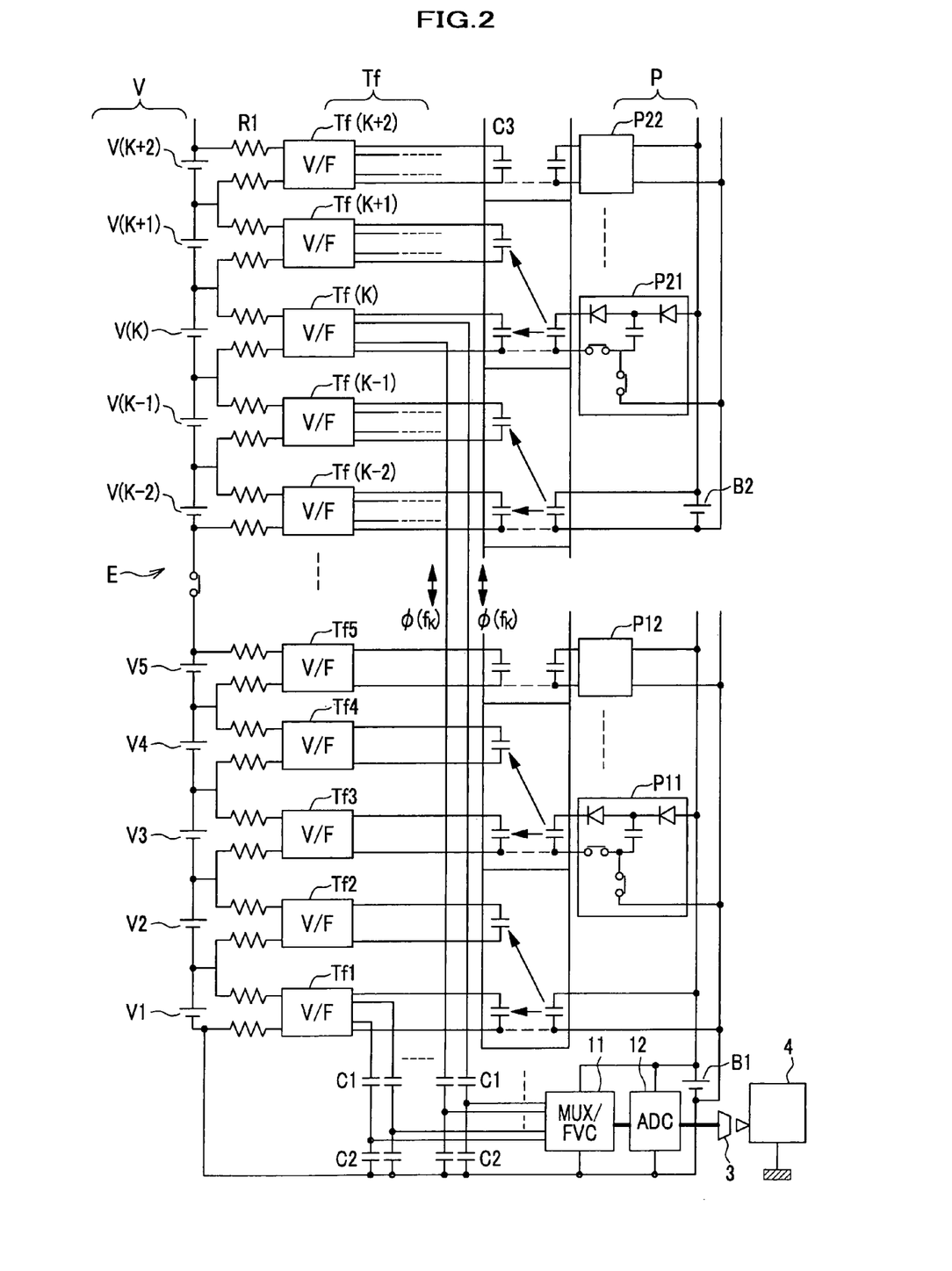
FIG. 2 is a block diagram of a battery voltage measurement circuit employing a voltage/frequency converter according to an embodiment of the present invention.

FIG. 2 is a block diagram of a battery voltage measurement circuit employing a voltage/frequency converter as the converter T according to an embodiment of the present invention. It should be noted that a voltage/frequency (V/F) converter Tf(K) includes the differential amplifier A(K) shown in FIG. 1.

With reference to FIG. 2, a description will be given on measurement operations in this embodiment.

For example, a voltage between both terminals of an unit battery V(K) is input to the V/F converter Tf(K) through an input resistance R1, which corresponds to an input unit in the claims, and is then converted by the V/F converter Tf(K) into a frequency signal φ(fk), which corresponds to the voltage between both terminals of the unit battery V(K). The converted frequency signal φ(fk) is applied through a capacitor C1 to a termination impedance C2 connected to the lowest electric potential of the battery assembly E, so that the frequency signal φ(fk) can be separated from a direct-current voltage on the unit battery V(K) side. Thereby, voltage signals of the individual unit batteries with different reference voltages can be easily shifted down to frequency signals φ(fk) on a reference potential of the lowest electric potential of the battery assembly E.

The input resistance R1 is an example of an input unit set forth in the claims.

The frequency signals φ(f1), . . . , φ(fk), . . . , which respectively correspond to voltages of the unit batteries V1, . . . , V(K), . . . and have been shifted down as described above, are sequentially converted by a common frequency/voltage converter (MUX/FVC) 11 into alternating-current voltage signals, which have frequencies of f1, . . . , fK, . . . , on a reference potential of the lowest electric potential of the battery assembly E. The frequency/voltage converter (MUX/FVC) 11 has an input multiplexer. The MUX/FVC 11 outputs multiplexed alternating-current voltage signals, which are then fed into an A/D converter (ADC) 12 to be converted into digital signals that represent values corresponding to the frequencies f1, . . . , fK, . . . . Then, the digital signals are transmitted to the control operation unit 4, which is placed in a main body and is connected to a grounded vehicle body, via the isolation buffer circuit 3 such as a photo-coupler.

As described above, frequency signals are converted into voltage signals by the common frequency/voltage converter 11 having the input multiplexer (MUX/FVC), and then the voltage signals are converted into digital signals by the common ADC 12, so that it is possible to convert detected signals into a series of serial digital signals, and to reduce the number of elements, including the isolation buffer circuit 3. Because a detection circuit including the common MUX/FVC 11 and the common ADC 12 is employed in the present embodiment, it is possible to reduce the variation of measurements in the battery channels. The detection circuit may be regarded as the same as the control unit 2 in FIG. 1.

The V/F converter Tf corresponds to a conversion unit set forth in the claims. The capacitor C1 and the termination impedance C2 includes a function of a level shifting unit set forth in the claims, and the MUX/FVC 11, the ADC 12, and the control operation unit 4 include a function of a measurement unit set forth in the claims.

Because a reference potential of the V/F converter Tf varies depending on an electric potential of the unit battery V to be measured, it is necessary to shift up a reference potential of the V/F converter Tf depending on an electric potential of the unit battery V in relation to the lowest electric potential of the battery assembly E. For this purpose, a charge pump P is used as a power source.

According to an embodiment of the present invention shown in FIG. 2, the unit batteries V constituting the battery assembly E are formed into two groups: a lower group consisting of V1, V2, . . . and an upper group consisting of V(K−2), V(K−1), . . . . The lower and upper groups have almost the same number of the unit batteries V. The lower and upper groups are provided with direct-current power sources B1 and B2, respectively. Further, in both the lower and upper groups, the unit batteries V are formed into a group consisting of two adjacent unit batteries V. The bottom groups in both the lower and upper groups are directly supplied with outputs of the direct-current power sources B1 and B2, and other higher groups in the lower and upper groups are provided with the charge pumps P, which are dedicated to each of the other higher groups. The charge pumps P in the lower group consisting of V1, V2, . . . are supplied with the electric power from the direct-current power source B1, and the charge pumps P in the upper group consisting of V(K−2), V(K−1), . . . are supplied with the electric power from the direct-current power source B2.

For example, in the lower group, the V/F converters Tf1 and Tf2 are supplied with the electric power directly from the direct-current power source B1, and the V/F converters Tf3 and Tf4 are supplied with the electric power from the charge pump P11 by using a voltage raised thereby. Similarly, other V/F converters Tf5, . . . in the lower group are supplied with the electric power from the charge pump P12 that is driven by the direct-current power source B1.

Similarly, in the upper group, the V/F converters Tf(K−2) and Tf(K−1) are supplied with the electric power directly from the direct-current power source B2, and the V/F converters Tf(K) and Tf(K+1) are supplied with the electric power from the charge pump P21 by using a voltage raised thereby.

When the power supply voltage of the V/F converter Tf decreases, the V/F converter Tf can output an erroneous conversion. Therefore, it is desirable to provide a circuit for detecting an abnormality of the power supply voltage, and prevent a false detection by stopping conversion when an abnormality occurs in the power supply voltage.

With the above-mentioned configuration, an element used as the V/F converter Tf, and a switching element and a capacitor used as the charge pump P need to withstand voltages higher than a voltage of the battery assembly E. However, an output voltage from the unit battery V is converted into a signal on a reference potential of the lowest electric potential of the battery assembly E, and therefore elements may have voltage resistance in one direction. Thereby, it is possible to reduce the number of elements and use more inexpensive elements.

Figure 3:
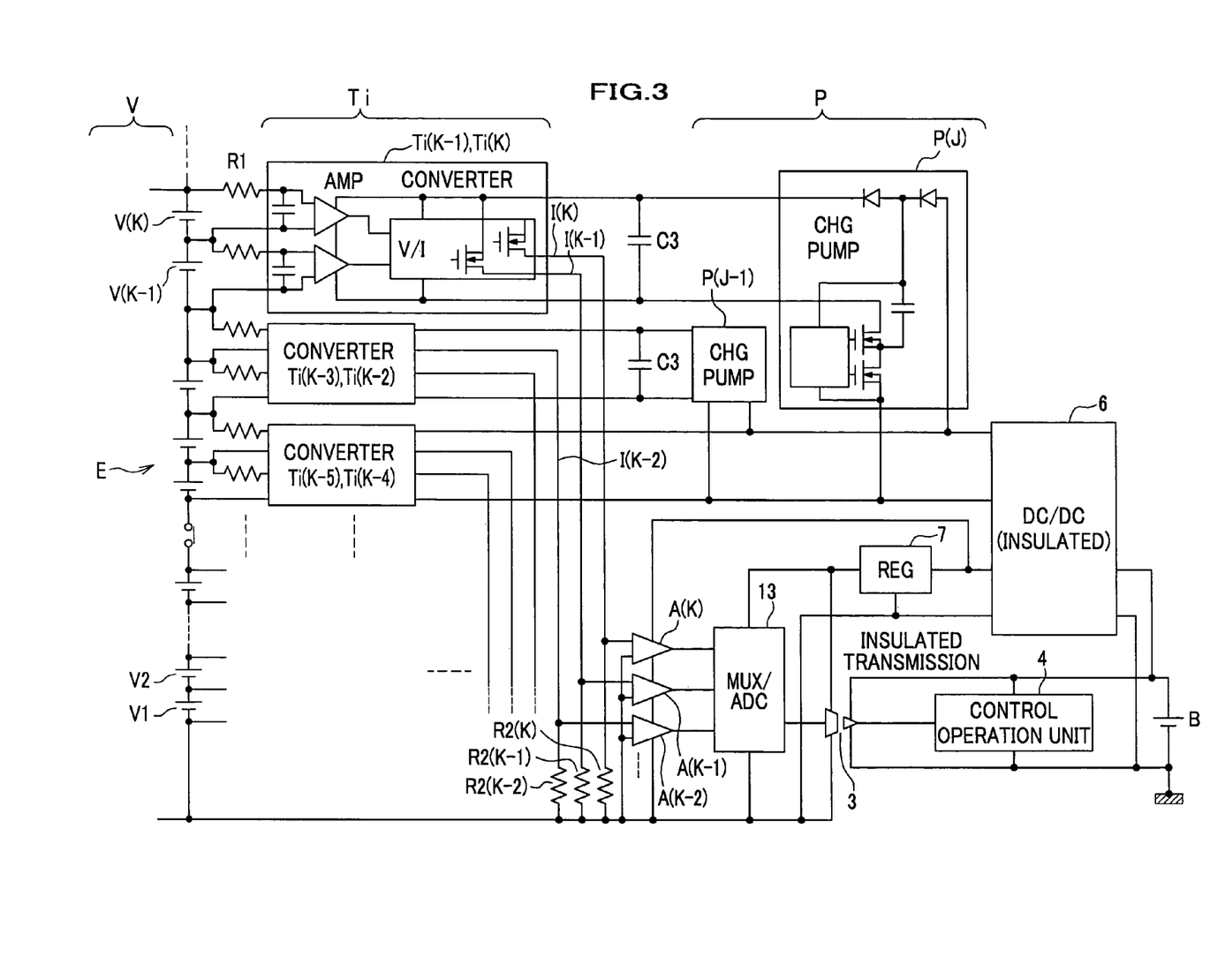
FIG. 3 is a block diagram of a battery voltage measurement circuit employing a voltage/current converter according to an embodiment of the present invention.

FIG. 3 is a block diagram of a battery voltage measurement circuit employing a voltage/current converter Ti as the converter T according to an embodiment of the present invention. In the battery voltage measurement circuit shown in FIG. 3, the unit batteries V1, V2, . . . , V(K−1), V(K) (the number of the unit batteries is K) constituting the battery assembly E are respectively provided with the voltage/current (V/I) converters Ti1, Ti2, . . . , Ti(K−1), Ti(K), each including an amplifier on its front stage. To simplify an explanation, K is an even number here. In the present embodiment, every two adjacent V/I converters Ti are provided with one charge pump P. In the embodiment as shown in FIG. 2, the unit batteries V constituting the battery assembly E are formed into a plurality of groups, each group is provided with a direct-current power source, and a bottom group in each group is supplied with the electric power directly from the direct-current power source. However, the embodiment shown in FIG. 3 does not employ such a configuration. In the embodiment in FIG. 3, every two V/I converters Ti are provided with one charge pump P, and therefore the circuit includes the charge pumps 1, . . . , PJ (J=K/2), that is, the number of the charge pumps is K/2. Therefore, two adjacent V/I converters Ti, which are supplied with the electric power from the same charge pump P, are shown in one block in FIG. 3, for instance, the converters Ti(K−1), Ti(K), the converters Ti(K−3), Ti(K−2), . . . . A high potential side terminal of each unit battery V(K) (K=1, 2, . . . , K) is coupled to a corresponding input terminal of a corresponding V/I converter Ti(K) through the resistance R1(an example of an input unit in the claims), and a low potential side terminal of each unit battery V(K) is directly connected to a corresponding input terminal of a corresponding V/I converter Ti(K). Outputs of the V/I converters Ti(K), Ti(K−1), Ti(K−2), . . . are connected to a common reference potential, i.e. the lowest electric potential of the battery assembly E, through detection resistances R2(K), R2 (K−1), . . . , which detect a voltage by measuring a voltage drop. High potential sides of the detection resistances R2(K), R2(K−1), . . . are connected to input terminals of amplifiers A(K), A(K−1), . . . , respectively. Outputs of the amplifiers A(K), A(K−1), . . . are connected to corresponding input terminals of an A/D converter 13 having a multiplexer (MUX/ADC). Outputs of the MUX/ADC 13 are connected to the control operation unit 4 in a circuit block (referred to as a low voltage side), which is electrically insulated from the battery assembly E, through the above-mentioned isolation buffer circuit 3. The battery voltage measurement circuit shown in FIG. 3 includes a DC/DC converter 6 and a regulator (REG) 7. The DC/DC converter 6 converts a voltage of an output from the direct-current power source B on the low voltage side. The REG 7 adjusts an output of the DC/DC converter 6 to be suitable for a power supply voltage used in an integrated circuit (IC). The DC/DC converter 6 is mainly used for driving the charge pumps P(J), P(J−1), . . . . The references I(K), I(K−1), I(K−2), . . . denote output currents from the V/I converters Ti(K), Ti(K−1), Ti(K−2), . . . .

In the present embodiment, a voltage between both terminals of the unit battery V is converted by the converter Ti into an electric current, and then the electric current is output. The converter Ti may be regarded as a voltage-controlled current source that outputs an electric current corresponding to a voltage between both terminals of the unit battery V. A value of an output current of the converter Ti is independent from a direct-current potential of the unit battery V in relation to the lowest electric potential of the battery assembly E. Therefore, by using an electric current output from the converter Ti, output voltages of the unit batteries V having different reference voltages can be easily shifted down to voltages on a common reference potential of the lowest electric potential of the battery assembly E.

With reference to FIG. 3, a description will be given on measurement operations in this embodiment.

A voltage between both terminals of each unit battery V(K) is input to the V/I converter Ti(K) through the input resistance R1, and is then converted by the V/I converter Ti(K) into a current signal I(K) that corresponds to the voltage between both terminals of the unit battery V(K). The converted current signal I(K) is applied to the termination resistance (detection resistance) R2(K), which is connected to the lowest potential of the battery assembly E, so that the current signal I(K) can be converted into a voltage signal on a common reference potential of the lowest electric potential of the battery assembly E. The termination resistances R2 have the same resistance value.

The converted voltage signals on a common reference potential are sequentially converted into digital voltage signals by the A/D converter 13 having a multiplexer function (MUX/ADC), thereby producing a series of serial digital signals. The series of serial digital signals are then transmitted to the control operation unit 4, which is disposed on the low voltage side and is grounded to vehicle body, via the isolation buffer circuit 3.

As described above, the voltage signals are sequentially converted into the digital voltage signals by the common A/D converter 13 having an input multiplexer (MUX/ADC) to produce a series of serial digital signals, and then the series of serial digital signals are transmitted to the isolation buffer circuit 3, so that it is possible to reduce the number of elements, including the isolation buffer circuit 3. Further, because the common MUX/ADC 13 is used, it is possible to reduce the variation of measurements between the battery channels.

The V/I converter Ti(K) includes a conversion unit set forth in the claims. The detection resistance (termination resistance) R2(K) includes a function of a level-shifting unit in the claims, and the MUX/ADC 13 and the control operation unit 4 includes a function of a measurement unit in the claims.

An output voltage of the insulated DC/DC converter 6, which converts a voltage of the direct current power source B on the low voltage side, is used as a reference supply. The voltage of the direct current power source B is, for example, level-shifted by the charge pump P(J), thereby charging an external capacitor C3, which is used as a power source of the V/I converters Ti(K), Ti(K−1). Furthermore, an output voltage of the DC/DC converter 6 is adjusted by the regulator 7 and is used as a power source of common elements such as the MUX/ADC 13 or the isolation buffer circuit 3.

A power source of the V/I converter Ti is configured as described above, and the V/I converter Ti is supplied with an electric power from the direct current power source B to output an electric current. For this reason, the electric power of the battery assembly E, which is an object to be measured, is not consumed for the measurement. Thereby, it is possible to realize high input resistance of an amplifier incorporated in the V/I converter Ti, and to reduce a capacity of a low-pass filter to be formed on an input side in order to remove battery noise. It is, therefore, possible to reduce the size and the cost.

With the configuration of the present embodiment, an element to be used as the V/I converter Ti and a switching element and a capacitor to be used as the charge pump P(J) need to withstand voltages higher than a voltage of the battery assembly E. However, because a voltage between both terminals of the unit battery V is converted into a signal on a common reference potential of the lowest electric potential of the battery assembly E, elements have only to withstand a high voltage in one direction, and therefore it is possible to reduce the number of elements and use more inexpensive elements. It is also possible to reduce the size and the cost.

Especially when the V/I converter Ti is used to convert an output of the unit battery V as described in the present embodiment, a multiplexer incorporated in the MUX/ADC 13 may have one input contact for each unit battery V, thereby simplifying the configuration of the circuit.

In the above-mentioned embodiment, voltages between both terminals of the unit batteries V are converted into and shifted down to frequency signals or electric currents, converted into a series of serial digital signals through a common measurement circuit, and then transmitted to the control operation unit 4 via the isolation buffer circuit 3. It is, however, possible to directly convert voltages between both terminals of the unit batteries V into digital signals by A/D conversion, and sequentially process digital signals that correspond to voltages of the unit batteries.

According to another embodiment of the present invention, a brief description will be given on a battery electric control unit (ECU) incorporating the above-mentioned battery voltage measurement circuit of the present invention.

Figure 4:
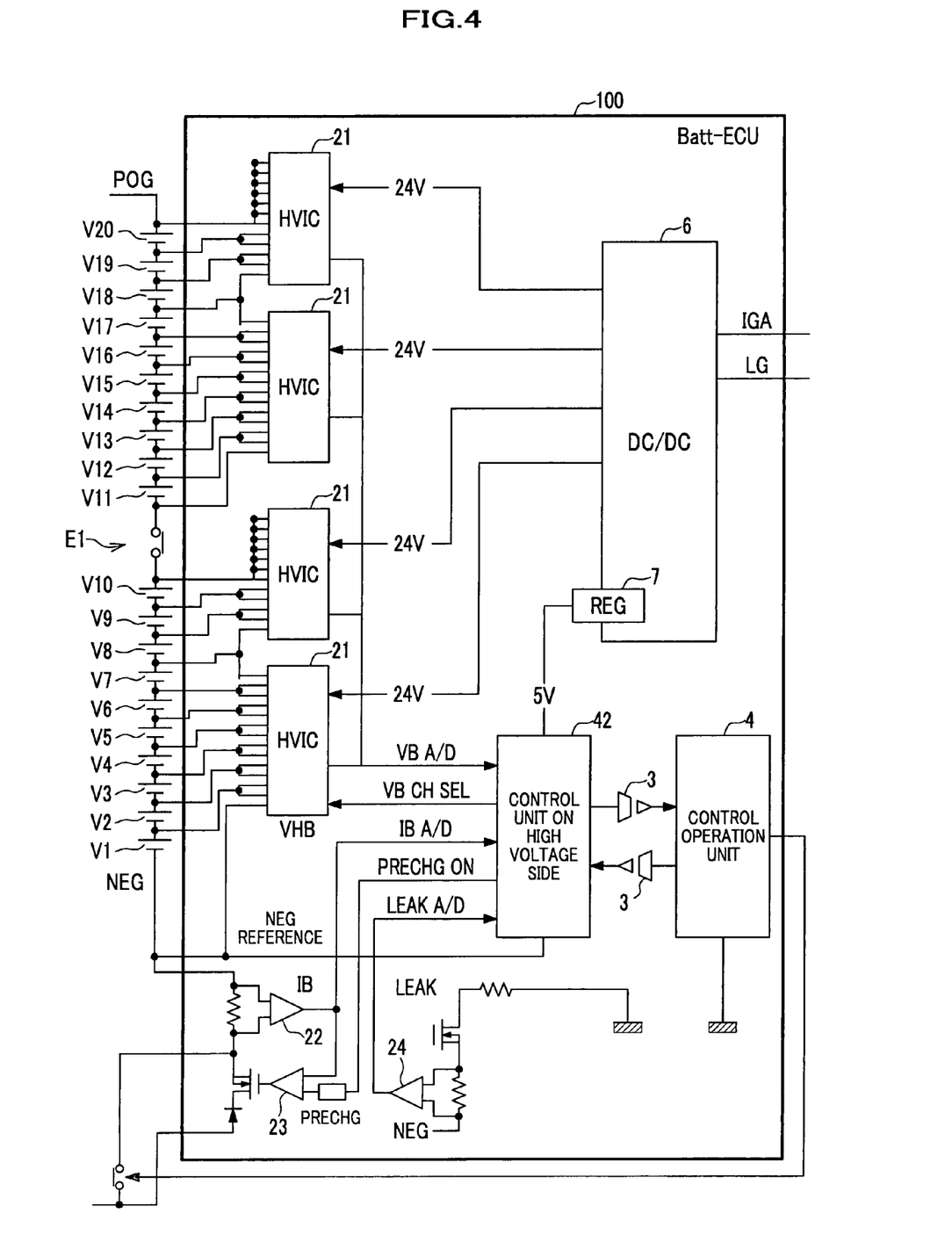
FIG. 4 is a block diagram of a battery electric control unit according to an embodiment of the present invention.
Figure 5:
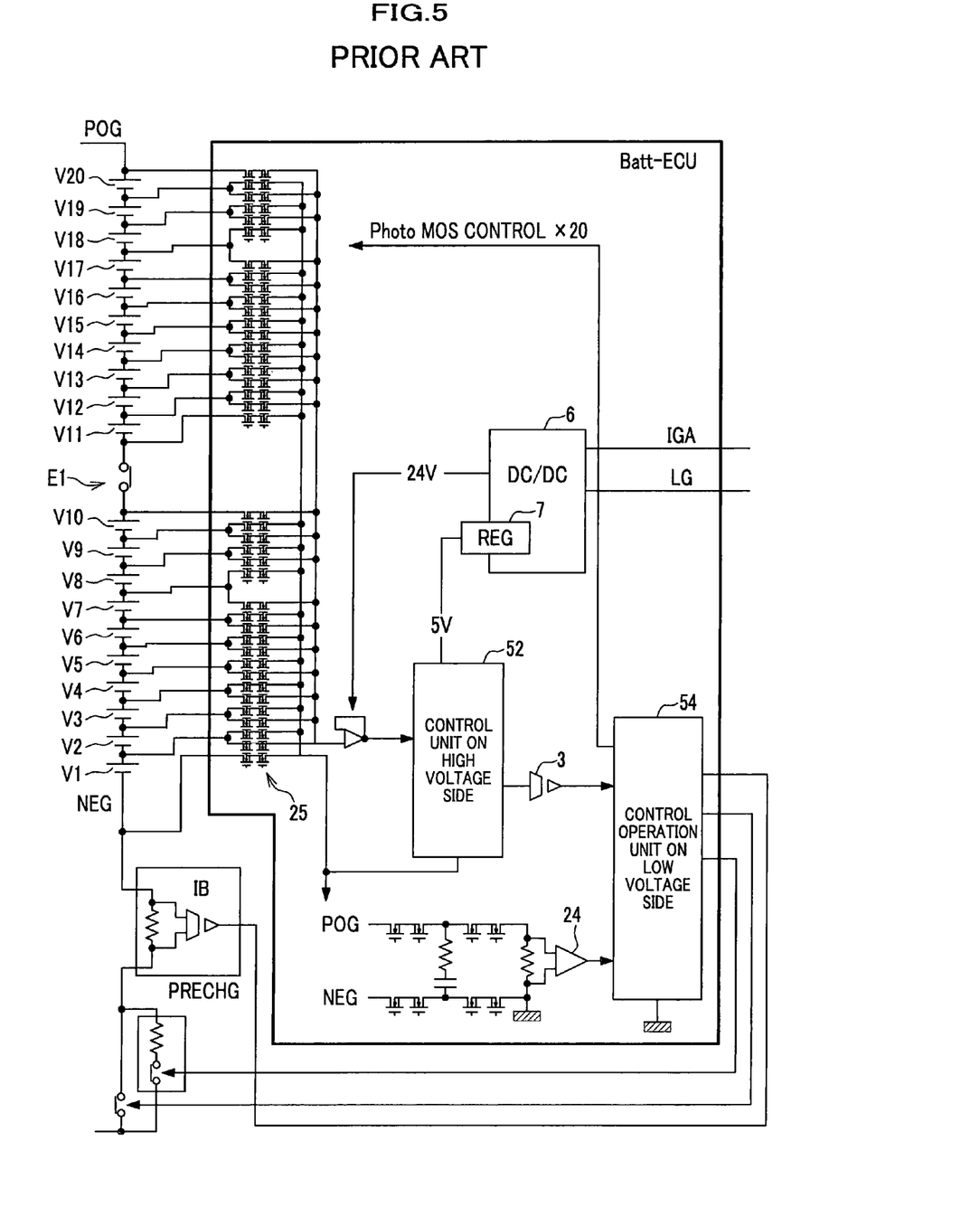
FIG. 5 is a block diagram of a conventional battery electric control unit.

FIG. 4 is a block diagram of a battery ECU 100 according to an embodiment of the present invention. For comparison, FIG. 5 shows a block diagram of a conventional battery ECU as described in the above-mentioned Japanese Laid-open Patent Application Hei. 11-113182. It should be noted that a control unit 42 on a high voltage side and a control operation unit 4 on a low voltage side, which are shown in FIG. 4, are replaced by a control unit 52 on a high voltage side and a control operation unit 54 on a low voltage side, which are shown in FIG. 5, respectively.

In FIG. 4, a high voltage integrated circuit (HVIC) 21 is configured by integrating circuits each including converters and charge pumps. The control unit 42 on the high voltage side has an inverse transform function, a multiplexer function, and an A/D conversion function. The isolation buffer circuit 3 includes a two-way circuit so that the isolation buffer circuit 3 transmits a measurement data from the control unit 42 on the high voltage side to the control operation unit 4 on the low voltage side, and the isolation buffer circuit 3 transmits a control signal from the control operation unit 4 on the low voltage side to the control unit 42 on the high voltage side. The DC/DC converter 6 and the regulator 7 operate in the same manner as mentioned with reference to FIG. 3.

By integrating input circuits by the HVICs as mentioned above, it is possible to reduce the number of components having high voltage resistance, and to reduce the size and the cost. Furthermore, the whole circuit can be easily integrated, and the battery voltage measurement functions can be integrated in one battery ECU 100.

A conventional battery ECU shown in FIG. 5 includes a switch circuit 25 having photo-MOS switch circuits (hereinafter referred to as channels). The channels of the switch circuit 25 are sequentially selected in response to a control signal transmitted from the control operation unit 54 on the low voltage side through an unshown isolation buffer element. Compared to the conventional battery ECU shown in FIG. 5, the battery ECU 100 shown in FIG. 4 makes it much easier to configure the circuit, thereby reducing the number of isolation elements such as the isolation buffer circuit.

According to an embodiment shown in FIG. 4, the lowest electric potential of an battery assembly E1, which is configured by unit batteries V1, V2, . . . , V20 (to simplify an explanation, the number of the unit batteries is 20), can be used as a common reference potential. As shown in FIG. 4, it is, therefore, possible to easily configure detection circuits for detecting an electric current or a voltage, and to incorporate a battery current detection circuit (IB) 22 and a precharge contactor (PRECHG) 23 inside the battery ECU 100. The precharge contactor 23 is used for charging a capacitor in a power supply circuit in advance when an ignition switch is turned on. Furthermore, a leakage detection circuit (LEAK) 24 between a high voltage side and a grounded vehicle body can be simplified and optimized in the configuration by using the lowest electric potential of the battery assembly E1 as a common reference potential. There is, therefore, an advantage that it is possible to reduce parts to be isolated in the circuit.

According to the present invention as described above, a voltage corresponding to a voltage between both terminals of each unit battery to be measured is converted into a converted signal, and is level-shifted to a voltage on a common reference potential. A voltage is detected by a common measurement unit with high accuracy, and a detected signal is transmitted as a serial digital signal to a control operation unit in a low voltage section via an isolation element. It is, therefore, possible to achieve a battery voltage measurement circuit that measures a voltage of each unit battery of a battery assembly with high accuracy in an inexpensive configuration without reducing the safety.

In the above description, examples of embodiments have been given to explain the present invention. It is, therefore, easy for a skilled person in the art to make various changes, modifications or additions in the above embodiments within the scope of the technical idea and the principle of the present invention.

For example, the above explanation has been given to mainly describe a battery voltage measurement circuit. However, the present invention should include a battery voltage measurement method to be used in the battery voltage measurement circuit.

According to the present invention, it is possible to detect a voltage of each battery such as a unit battery of a battery assembly during operation with high accuracy by using the smaller number of components than that of a conventional battery voltage measurement circuit. The present invention, therefore, can be widely used in the industry which requires monitoring of a battery voltage, mainly in the wide range of industries where a fuel cell is used.

What is claimed is:

1. A battery voltage measurement circuit that measures a voltage between two electrodes of each unit battery in a battery assembly having a plurality of unit batteries which are connected in series, the battery voltage measurement circuit comprising:
   conversion units each provided respectively to each unit battery to convert a voltage between the two electrodes of each unit battery into respective predetermined physical quantities;
   a level shifting unit to convert the physical quantities converted by the conversion units into voltages relative to a lowest electric potential of the battery assembly, wherein the level shifting unit is directly connected to the lowest electric potential of the battery assembly;
   a measurement unit that processes and measures the physical quantities converted by the conversion units with respect to each of the unit batteries; and
   a power source, isolated from the battery assembly, to supply power to the conversion units;
   wherein the measurement unit sequentially outputs digital values corresponding to the converted voltages based on the lowest electric potential of the battery assembly with respect to the unit batteries; and
   wherein each conversion unit includes a voltage-current conversion unit that converts the voltage between the two electrodes of each unit battery into a corresponding magnitude of an electric current.

2. The battery voltage measurement circuit according to claim 1, wherein the measurement unit includes an A/D conversion unit that converts the voltage between both electrodes of the unit battery into a corresponding digital signal.

3. The battery voltage measurement circuit according to claim 1, wherein the conversion units each corresponding to each of the unit batteries are formed into groups consisting of a predetermined number of the conversion units, which are adjacent to each other; each group is provided with a charge pump circuit; and the conversion unit in each group operates with a power supply from the charge pump circuit associated with the each group.

4. The battery voltage measurement circuit according to claim 3, further comprising a DC/DC converter that is electrically insulated from the battery assembly and is used as an power source for each charge pump circuit.

5. The battery voltage measurement circuit according to claim 1,
   wherein each conversion unit includes a voltage-frequency conversion unit that converts the voltage between the two electrodes of each unit battery into an alternating signal having a corresponding frequency.

6. The battery voltage measurement circuit according to claim 1, further comprising:
   a control operation unit that is electrically insulated from the battery assembly; and a transmitting unit that electrically transmits the digital value corresponding to the voltage between the two electrodes of each unit battery from the measurement unit into the control operation unit while keeping insulation between the battery assembly and the control operation unit.

* * * * *